(12) United States Patent
Kim et al.

(10) Patent No.: US 11,048,441 B2
(45) Date of Patent: Jun. 29, 2021

(54) SEMICONDUCTOR DEVICES

(71) Applicant: SK hynix Inc., Icheon-si (KR)

(72) Inventors: Woongrae Kim, Icheon-si (KR); Woo Jin Kang, Seoul (KR); Seung Wook Oh, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/677,557

(22) Filed: Nov. 7, 2019

(65) Prior Publication Data

US 2020/0379680 A1 Dec. 3, 2020

(30) Foreign Application Priority Data

May 31, 2019 (KR) ........................ 10-2019-0064548

(51) Int. Cl.
  *G11C 7/22* (2006.01)
  *G06F 3/06* (2006.01)
  *G11C 8/18* (2006.01)

(52) U.S. Cl.
  CPC .......... *G06F 3/0659* (2013.01); *G06F 3/0604* (2013.01); *G06F 3/0679* (2013.01); *G11C 7/222* (2013.01); *G11C 8/18* (2013.01)

(58) Field of Classification Search
  CPC .................................................. G11C 7/222

USPC ....................................................... 365/233.1
See application file for complete search history.

(56) References Cited

U.S. PATENT DOCUMENTS

2007/0086267 A1* 4/2007 Kwak ...................... G11C 7/22
                                                             365/233.1
2019/0027199 A1   1/2019 Lee et al.

FOREIGN PATENT DOCUMENTS

KR              101143488 B1    5/2012

* cited by examiner

*Primary Examiner* — Jason Lappas
(74) *Attorney, Agent, or Firm* — William Park & Associates Ltd.

(57) ABSTRACT

A semiconductor device includes an internal clock generation circuit, a command generation circuit, and an address generation circuit. The internal clock generation circuit generates a command clock signal and an inverted command clock signal, wherein a cycle of the command clock signal and a cycle of the inverted command clock signal are determined by a mode. The command generation circuit generates a first command based on a first internal control signal and the command clock signal and generates a second command based on a second internal control signal and the inverted command clock signal. The address generation circuit generates a latch address based on the first internal control signal or a second internal control signal.

12 Claims, 12 Drawing Sheets

SEMICONDUCTOR DEVICES

CROSS-REFERENCE TO RELATED APPLICATIONS

The present application claims priority under 35 U.S.C 119(a) to Korean Application No. 10-2019-0064548, filed on May 31, 2019, which is incorporated herein by reference in its entirety.

BACKGROUND

1. Technical Field

Embodiments of the present disclosure relate to semiconductor devices generating commands and addresses.

2. Related Art

Semiconductor devices may receive an external control signal in synchronization with a clock signal to generate commands and addresses for performing various internal operations such as a read operation and a write operation. As an operation speed of the semiconductor devices increases, a frequency of the clock signal may increase. In such a case, the margin between the command and the address may be reduced when the command and the address are generated from the external control signal.

SUMMARY

According to an embodiment, a semiconductor device includes an internal clock generation circuit, a command generation circuit, and an address generation circuit. The internal clock generation circuit is configured to generate a command clock signal and an inverted command clock signal, wherein a cycle of the command clock signal and a cycle of the inverted command clock signal are determined by a mode. The command generation circuit is configured to generate a first command based on a first internal control signal and the command clock signal and is configured to generate a second command based on a second internal control signal and the inverted command clock signal. The address generation circuit is configured to generate a latch address based on the first internal control signal or a second internal control signal based on the command clock signal, the inverted command clock signal, the first command, and the second command according to the mode.

According to another embodiment, a semiconductor device includes an internal clock generation circuit and an address generation circuit. The internal clock generation circuit is configured to generate a command clock signal and an inverted command clock signal, wherein a cycle of the command clock signal and a cycle of the inverted command clock signal are controlled determined by a first mode and a second mode. The address generation circuit is configured to generate a latch address at a point in time when a period corresponding to 'N' times a cycle of a clock signal elapses from a point in time when a first command or a second command is generated in the first mode and is configured to generate the latch address at a point in time when a period corresponding to '2×N' times a cycle of the clock signal elapses from a point in time when the first command or the second command is generated in the second mode. The number 'N' is a natural number.

DETAILED DESCRIPTION OF THE EMBODIMENTS

Figure 1:
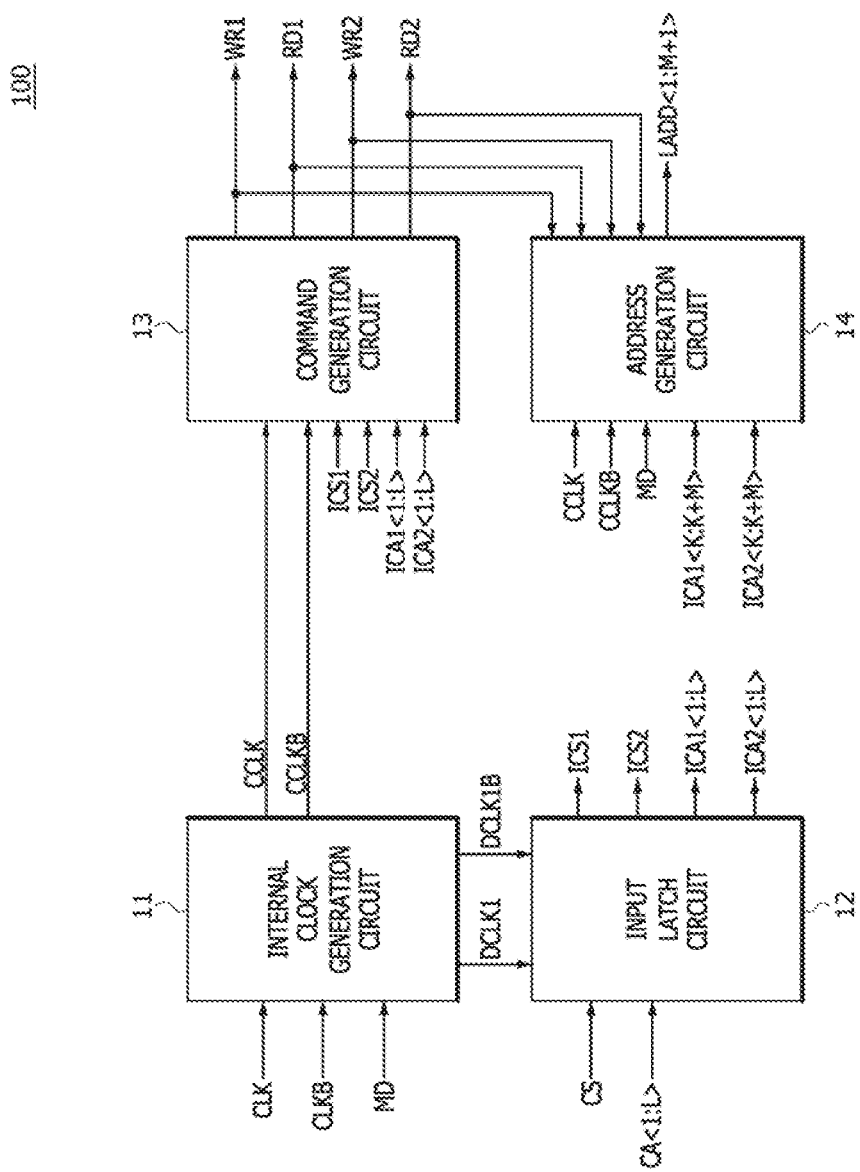
FIG. 1 is a block diagram, illustrating a configuration of a semiconductor device, according to an embodiment of the present disclosure.

Various embodiments of the present disclosure will be described hereinafter with reference to the accompanying drawings. However, the embodiments described herein are for illustrative purposes only and are not intended to limit the scope of the present disclosure.

The embodiments according to the concept of the present disclosure can be modified in various ways and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

As illustrated in FIG. 1, a semiconductor device 100, according to an embodiment, may include an internal clock generation circuit 11, an input latch circuit 12, a command generation circuit 13, and an address generation circuit 14.

The internal clock generation circuit 11 may generate a first division clock signal DCLK1, a first inverted division clock signal DCLK1B, a command clock signal CCLK, and an inverted command clock signal CCLKB, from a clock signal CLK and an inverted clock signal CLKB, based on a mode signal MD. The internal clock generation circuit 11 may divide the clock signal CLK and the inverted clock signal CLKB to generate the first division clock signal DCLK1 and the first inverted division clock signal DCLK1B. The first division clock signal DCLK1 and the first inverted division clock signal DCLK1B may be generated to be 2K-division signals of the clock signal CLK (where, 'K' denotes a natural number). In other words, the 2K-division signals of the clock signal CLK are signals having a cycle '2×K' times the cycle of the clock signal CLK. The internal clock generation circuit 11 may generate the command clock signal CCLK and the inverted command clock signal CCLKB, corresponding to the 2K-division signals of the clock signal CLK when the mode signal MD has a first logic level. The internal clock generation circuit 11 may generate the command clock signal CCLK and the inverted command clock signal CCLKB corresponding to 4K-division signals of the clock signal CLK when the mode signal MD has a second logic level. The mode signal MD may be set to have the first logic level when 'N' cycles of the clock signal CLK elapse after an internal command is generated in a first mode (where, 'N' denotes a natural number). An internal address may also be generated in the first mode after the internal command is generated. The mode signal MD may be set to have the second logic level when '2×N' cycles of the clock signal CLK elapse after the internal command is generated in a second mode. Again, the internal address may also be generated in the second mode after the internal command is generated. The first and second logic levels may be different according to the embodiments. The internal command may include a first write command WR1, a first read command RD1, a second write command WR2, and a second read command RD2. The internal address may include a latch address LADD<1:M+1>. A configuration and an operation of the internal clock generation circuit 11 will be described more fully with reference to FIGS. 2 to 4.

The input latch circuit 12 may generate a first internal chip selection signal ICS1, a second internal chip selection signal ICS2, a first internal control signal ICA1<1:L>, and a second internal control signal ICA2<1:L>, from a chip selection signal CS and an external control signal CA<1:L>, based on the first division clock signal DCLK1 and the first inverted division clock signal DCLK1B. The input latch circuit 12 may generate the first internal chip selection signal ICS1 from the chip selection signal CS based on the first division clock signal DCLK1. The input latch circuit 12 may latch the chip selection signal CS in synchronization with a point in time (hereinafter, referred to as 'a rising edge') when a level of the first division clock signal DCLK1 changes from a logic "low" level into a logic "high" level and may output the latched signal of the chip selection signal CS as the first internal chip selection signal ICS1. In some embodiments, the input latch circuit 12 may generate the first internal chip selection signal ICS1 from the chip selection signal CS in synchronization with a point in time (hereinafter, referred to as 'a falling edge') when a level of the first division clock signal DCLK1 changes from a logic "high" level into a logic "low" level. In the external control signal CA<1:L>, the first internal control signal ICA1<1:L>, and the second internal control signal ICA2<1:L>, "L" may be a natural number which is equal to or greater than two.

The input latch circuit 12 may generate the second internal chip selection signal ICS2 from the chip selection signal CS based on the first inverted division clock signal DCLK1B. The input latch circuit 12 may latch the chip selection signal CS in synchronization with a rising edge of the first inverted division clock signal DCLK1B and may output the latched signal of the chip selection signal CS as the second internal chip selection signal ICS2. In some embodiments, the input latch circuit 12 may generate the second internal chip selection signal ICS2 from the chip selection signal CS in synchronization with a falling edge of the first inverted division clock signal DCLK1B.

The input latch circuit 12 may generate the first internal control signal ICA1<1:L> from the external control signal CA<1:L> based on the first division clock signal DCLK1. The input latch circuit 12 may latch the external control signal CA<1:L> in synchronization with a rising edge of the first division clock signal DCLK1 and may output the latched signal of the external control signal CA<1:L> as the first internal control signal ICA1<1:L>. In some embodiments, the input latch circuit 12 may generate the first internal control signal ICA1<1:L> from the external control signal CA<1:L> in synchronization with a falling edge of the first division clock signal DCLK1.

The input latch circuit 12 may generate the second internal control signal ICA2<1:L> from the external control signal CA<1:L> based on the first inverted division clock signal DCLK1B. The input latch circuit 12 may latch the external control signal CA<1:L> in synchronization with a rising edge of the first inverted division clock signal DCLK1B and may output the latched signal of the external control signal CA<1:L> as the second internal control signal ICA2<1:L>. In some embodiments, the input latch circuit 12 may generate the second internal control signal ICA2<1:L> from the external control signal CA<1:L> in synchronization with a falling edge of the first inverted division clock signal DCLK1B. A configuration and an operation of the input latch circuit 12 will be described more fully with reference to FIGS. 5 to 7.

The command generation circuit 13 may generate the first write command WR1, the first read command RD1, the second write command WR2, and the second read command RD2, from the first internal chip selection signal ICS1, the second internal chip selection signal ICS2, the first internal control signal ICA1<1:L>, and the second internal control signal ICA2<1:L>, based on the command clock signal CCLK and the inverted command clock signal CCLKB. The command generation circuit 13 may generate the first write command WR1 and the first read command RD1 from the first internal chip selection signal ICS1 and the first internal control signal ICA1<1:L> based on the command clock signal CCLK. The command generation circuit 13 may generate the second write command WR2 and the second read command RD2 from the second internal chip selection signal ICS2 and the second internal control signal ICA2<1:L> based on the inverted command clock signal CCLKB.

When the first internal control signal ICA1<1:L>, having a first logic level combination, is inputted, the command generation circuit 13 may be synchronized with a rising edge of the command clock signal CCLK to generate the first write command WR1 while the first internal chip selection signal ICS1 has a logic "high" level. In an embodiment, the command generation circuit 13 may generate the first write command WR1 in synchronization with a falling edge of the command clock signal CCLK. In another embodiment, the command generation circuit 13 may generate the first write command WR1 while the first internal chip selection signal ICS1 has a logic "low" level. The first logic level combination may be different according to the embodiments.

When the first internal control signal ICA1<1:L>, having a second logic level combination, is inputted, the command generation circuit 13 may be synchronized with a rising edge of the command clock signal CCLK to generate the first read command RD1 while the first internal chip selection signal ICS1 has a logic "high" level. In an embodiment, the command generation circuit 13 may generate the first read command RD1 in synchronization with a falling edge of the command clock signal CCLK. In another embodiment, the command generation circuit 13 may generate the first read command RD1 while the first internal chip selection signal ICS1 has a logic "low" level. The second logic level combination may be different according to the embodiments.

When the second internal control signal ICA2<1:L> having a third logic level combination is inputted, the command generation circuit 13 may be synchronized with a rising edge of the inverted command clock signal CCLKB to generate the second write command WR2 while the second internal chip selection signal ICS2 has a logic "high" level. In an embodiment, the command generation circuit 13 may generate the second write command WR2 in synchronization with a falling edge of the inverted command clock signal CCLKB. In another embodiment, the command generation circuit 13 may generate the second write command WR2 while the second internal chip selection signal ICS2 has a logic "low" level. The third logic level combination may be different according to the embodiments.

When the second internal control signal ICA2<1:L> having a fourth logic level combination is inputted, the command generation circuit 13 may be synchronized with a rising edge of the inverted command clock signal CCLKB to generate the second read command RD2 while the second internal chip selection signal ICS2 has a logic "high" level. In an embodiment, the command generation circuit 13 may generate the second read command RD2 in synchronization with a falling edge of the inverted command clock signal CCLKB. In another embodiment, the command generation circuit 13 may generate the second read command RD2 while the second internal chip selection signal ICS2 has a logic "low" level. The fourth logic level combination may be different according to the embodiments. A configuration and an operation of the command generation circuit 13 will be described more fully with reference to FIG. 8.

The address generation circuit 14 may generate the latch address LADD<1:M+1>, from a first internal control signal ICA1<K:K+M> and a second internal control signal ICA2<K:K+M>, based on the command clock signal CCLK, the inverted command clock signal CCLKB, the mode signal MD, the first write command WR1, the first read command RD1, the second write command WR2, and the second read command RD2. In the latch address LADD<1:M+1>, the first internal control signal ICA1<K:K+M>, and the second internal control signal ICA2<K:K+M>, "K" and "M" may be natural numbers.

When the first write command WR1 or the second write command WR2 is generated, the address generation circuit 14 may latch the first internal control signal ICA1<K:K+M> or the second internal control signal ICA2<K:K+M>, based on the command clock signal CCLK, the inverted command clock signal CCLKB, and the mode signal MD to generate the latch address LADD<1:M+1>. When the first write command WR1 is generated, the address generation circuit 14 may latch the second internal control signal ICA2<K:K+M> to generate the latch address LADD<1:M+1> while the mode signal MD has the first logic level. Furthermore, when the second write command WR2 is generated, the address generation circuit 14 may latch the first internal control signal ICA1<K:K+M> to generate the latch address LADD<1:M+1> while the mode signal MD has the first logic level. On the hand, when the first write command WR1 is generated, the address generation circuit 14 may latch the first internal control signal ICA1<K:K+M> to generate the latch address LADD<1:M+1> while the mode signal MD has the second logic level. When the second write command WR2 is generated, the address generation circuit 14 may latch the second internal control signal ICA2<K:K+M> to generate the latch address LADD<1:M+1> while the mode signal MD has the second logic level.

The address generation circuit 14 may latch the first internal control signal ICA1<K:K+M> or the second internal control signal ICA2<K:K+M> based on the command clock signal CCLK, the inverted command clock signal CCLKB, and the mode signal MD, to generate the latch address LADD<1:M+1> when the first read command RD1 or the second read command RD2 is generated. When the first read command RD1 is generated, the address generation circuit 14 may latch the second internal control signal ICA2<K:K+M> to generate the latch address LADD<1:M+1> while the mode signal MD has the first logic level. When the second read command RD2 is generated, the address generation circuit 14 may latch the first internal control signal ICA1<K:K+M> to generate the latch address LADD<1:M+1> while the mode signal MD has the first logic level. When the first read command RD1 is generated, the address generation circuit 14 may latch the first internal control signal ICA1<K:K+M> to generate the latch address LADD<1:M+1> while the mode signal MD has the second logic level. When the second read command RD2 is generated, the address generation circuit 14 may latch the second internal control signal ICA2<K:K+M> to generate the latch address LADD<1:M+1> while the mode signal MD has the second logic level. A configuration and an operation of the address generation circuit 14 will be described more fully with reference to FIG. 9.

Figure 2:
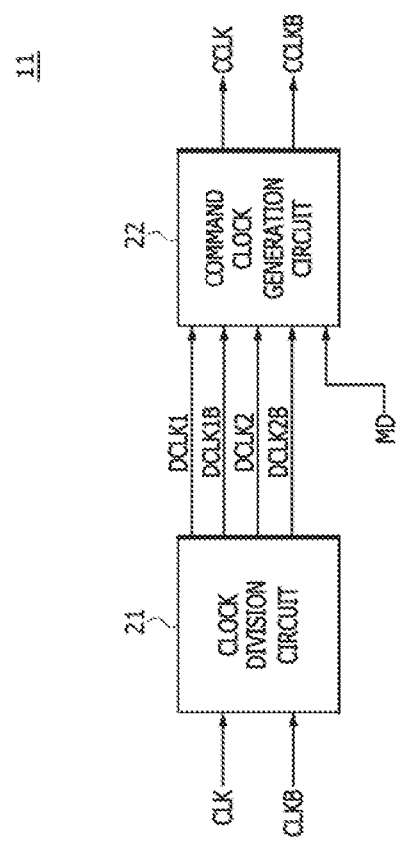
FIG. 2 is a block diagram, illustrating an example of an internal clock generation circuit, included in the semiconductor device of FIG. 1.

Referring to FIG. 2, the internal clock generation circuit 11 may include a clock division circuit 21 and a command clock generation circuit 22. The clock division circuit 21 may divide the clock signal CLK and the inverted clock signal CLKB to generate a first division clock signal DCLK1, a first inverted division clock signal DCLK1B, a second division clock signal DCLK2, and a second inverted division clock signal DCLK2B. The first division clock signal DCLK1 and the first inverted division clock signal DCLK1B may be generated to be 2-division signals of the clock signal CLK. The second division clock signal DCLK2 and the second inverted division clock signal DCLK2B may be generated to be 4-division signals of the clock signal CLK. The command clock generation circuit 22 may generate the command clock signal CCLK and the inverted command clock signal CCLKB from the first division clock signal DCLK1, the first inverted division clock signal DCLK1B, the second division clock signal DCLK2 and the second inverted division clock signal DCLK2B based on the mode signal MD. The command clock generation circuit 22 may output the first division clock signal DCLK1 and the first inverted division clock signal DCLK1B as the command clock signal CCLK and the inverted command clock signal CCLKB when the mode signal MD has the first logic level. The command clock generation circuit 22 may output the second division clock signal DCLK2 and the second inverted division clock signal DCLK2B as the command clock signal CCLK and the inverted command clock signal CCLKB when the mode signal MD has the second logic level. In the present embodiment, the first logic level may be set as a logic "low" level, and the second logic level may be set as a logic "high" level.

Figure 3:
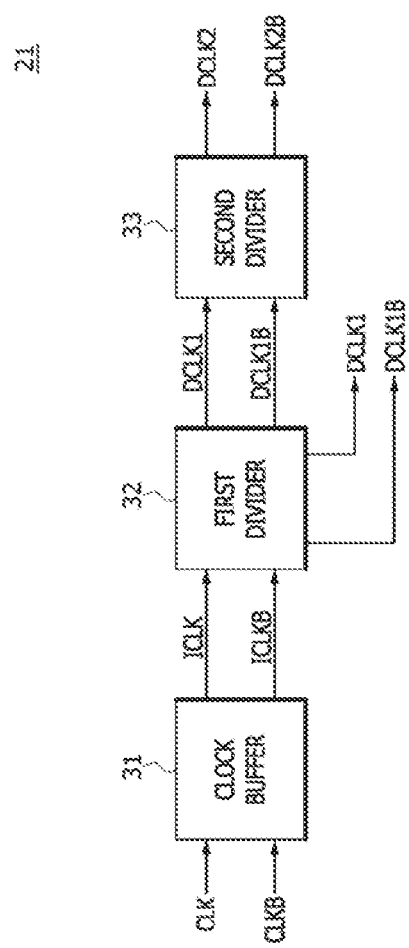
FIG. 3 is a block diagram, illustrating an example of a clock division circuit, included in the internal clock generation circuit of FIG. 2.

Referring to FIG. 3, the clock division circuit 21 may include a clock buffer 31, a first divider 32, and a second divider 33. The clock buffer 31 may buffer the clock signal CLK to generate an internal clock signal ICLK. The clock buffer 31 may buffer the inverted clock signal CLKB to generate an inverted internal clock signal ICLKB. The first divider 32 may divide the internal clock signal ICLK and the inverted internal clock signal ICLKB to generate the first division clock signal DCLK1 and the first inverted division clock signal DCLK1B. The first division clock signal DCLK1 and the first inverted division clock signal DCLK1B may be generated to be 2-division signals of the internal clock signal ICLK and the inverted internal clock signal ICLKB. The first division clock signal DCLK1 and the first inverted division clock signal DCLK1B may be directly outputted to the second divider and the command clock generation circuit 22. The second divider 33 may divide the first division clock signal DCLK1 and the first inverted division clock signal DCLK1B to generate the second division clock signal DCLK2 and the second inverted division clock signal DCLK2B. The second division clock signal DCLK2 and the second inverted division clock signal DCLK2B may be generated to be 4-division signals of the internal clock signal ICLK and the inverted internal clock signal ICLKB.

Figure 4:
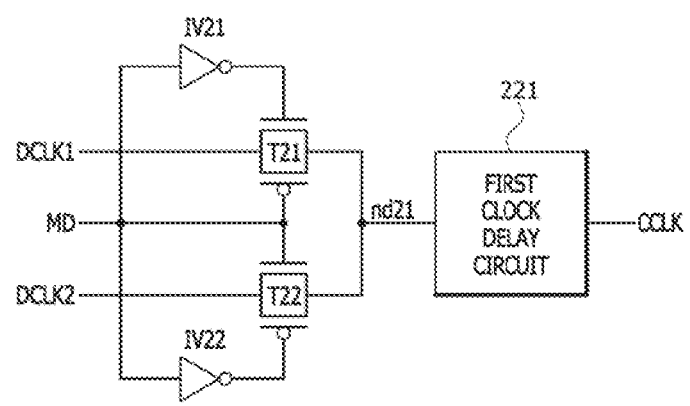
FIG. 4 illustrates an example of a command clock generation circuit, included in the internal clock generation circuit of FIG. 2.
Figure 4:
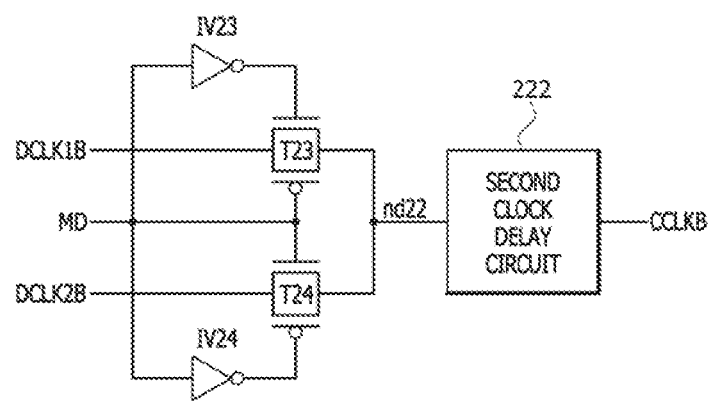

Referring to FIG. 4, the command clock generation circuit 22 may include inverters IV21, IV22, IV23 and IV24, transfer gates T21, T22, T23 and T24, a first clock delay circuit 221, and a second clock delay circuit 222. The inverter IV21 may inversely buffer the mode signal MD to output the inversely buffered signal of the mode signal MD. The transfer gate T21 may be turned on to output the first division clock signal DCLK1 to a node nd21 when the mode signal MD has a logic "low" level. The inverter IV22 may inversely buffer the mode signal MD to output the inversely buffered signal of the mode signal MD. The transfer gate T22 may be turned on to output the second division clock signal DCLK2 to the node nd21 when the mode signal MD has a logic "high" level. The first clock delay circuit 221 may delay a signal of the node nd21 by a first clock delay period to generate the command clock signal CCLK. The inverter IV23 may inversely buffer the mode signal MD to output the inversely buffered signal of the mode signal MD. The transfer gate T23 may be turned on to output the first inverted division clock signal DCLK1B to a node nd22 when the mode signal MD has a logic "low" level. The inverter IV24 may inversely buffer the mode signal MD to output the inversely buffered signal of the mode signal MD. The transfer gate T24 may be turned on to output the second inverted division clock signal DCLK2B to the node nd22 when the mode signal MD has a logic "high" level. The second clock delay circuit 222 may delay a signal of the node nd22 by a second clock delay period to generate the inverted command clock signal CCLKB.

The command clock generation circuit 22 may output the first division clock signal DCLK1 and the first inverted division clock signal DCLK1B as the command clock signal CCLK and the inverted command clock signal CCLKB when the mode signal MD has a logic "low" level. The command clock generation circuit 22 may output the second division clock signal DCLK2 and the second inverted division clock signal DCLK2B as the command clock signal CCLK and the inverted command clock signal CCLKB when the mode signal MD has a logic "high" level.

Figure 5:
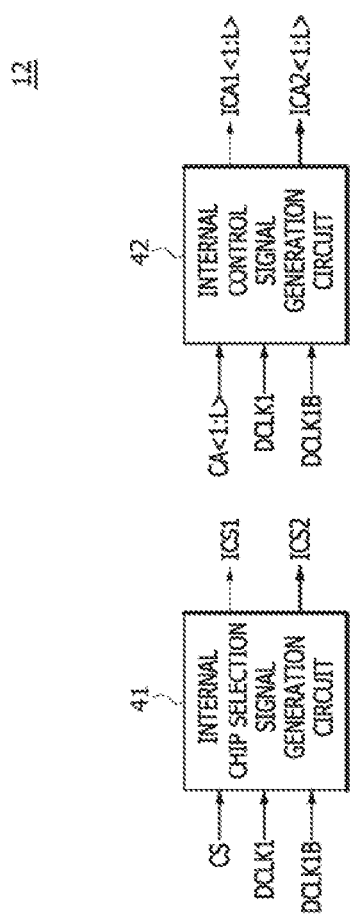
FIG. 5 is a block diagram, illustrating an example of an input latch circuit, included in the semiconductor device of FIG. 1.

Referring to FIG. 5, the input latch circuit 12 may include an internal chip selection signal generation circuit 41 and an internal control signal generation circuit 42. The internal chip selection signal generation circuit 41 may generate the first internal chip selection signal ICS1 and the second internal chip selection signal ICS2 from the chip selection signal CS based on the first division clock signal DCLK1 and the first inverted division clock signal DCLK1B. The internal chip selection signal generation circuit 41 may latch the chip selection signal CS in synchronization with a rising edge of the first division clock signal DCLK1 and may output the latched signal of the chip selection signal CS as the first internal chip selection signal ICS1. The internal chip selection signal generation circuit 41 may latch the chip selection signal CS in synchronization with a rising edge of the first inverted division clock signal DCLK1B and may output the latched signal of the chip selection signal CS as the second internal chip selection signal ICS2. The internal control signal generation circuit 42 may generate the first internal control signal ICA1<1:L> and the second internal control signal ICA2<1:L> from the external control signal CA<1:L> based on the first division clock signal DCLK1 and the first inverted division clock signal DCLK1B. The internal control signal generation circuit 42 may latch the external control signal CA<1:L> in synchronization with a rising edge of the first division clock signal DCLK1 and may output the latched signal of the external control signal CA<1:L> as the first internal control signal ICA1<1:L>. The internal control signal generation circuit 42 may latch the external control signal CA<1:L> in synchronization with a rising edge of the first inverted division clock signal DCLK1B and may output the latched signal of the external control signal CA<1:L> as the second internal control signal ICA2<1:L>.

Figure 6:
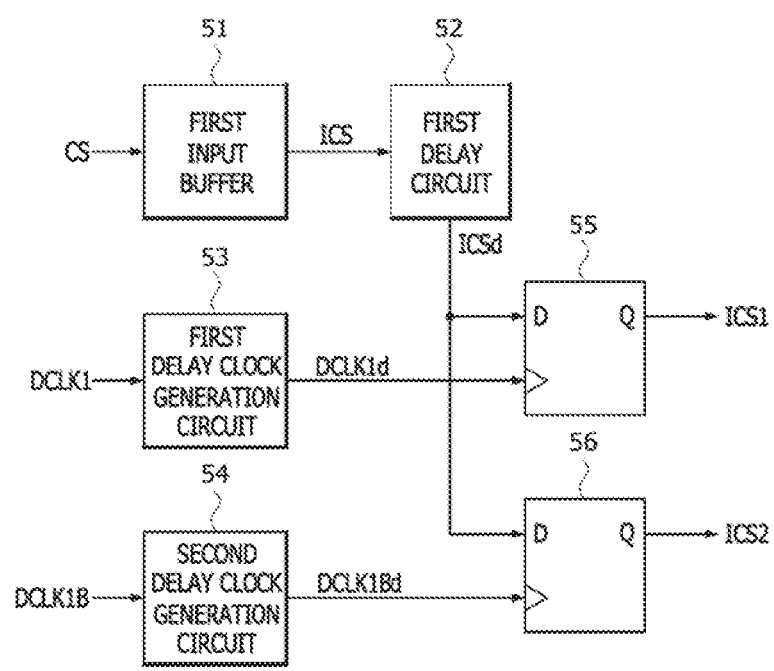
FIG. 6 illustrates an example of an internal chip selection signal generation circuit, included in the input latch circuit of FIG. 5.

Referring to FIG. 6, the internal chip selection signal generation circuit 41 may include a first input buffer 51, a first delay circuit 52, a first delay clock generation circuit 53, a second delay clock generation circuit 54, a first clock output/latch circuit 55, and a second clock output/latch circuit 56. The first input buffer 51 may buffer the chip selection signal CS to generate an internal chip selection signal ICS. The first delay circuit 52 may delay the internal chip selection signal ICS to generate a delayed chip selection signal ICSd. The first delay clock generation circuit 53 may delay the first division clock signal DCLK1 to generate a first delayed division clock signal DCLK1d. The second delay clock generation circuit 54 may delay the first inverted division clock signal DCLK1B to generate a first delayed inverted division clock signal DCLK1Bd. The first clock output/latch circuit 55 may latch the delayed chip selection signal ICSd in synchronization with a rising edge of the first delayed division clock signal DCLK1d and may output the latched signal of the delayed chip selection signal ICSd as the first internal chip selection signal ICS1. The second clock output/latch circuit 56 may latch the delayed chip selection signal ICSd in synchronization with a rising edge of the first delayed inverted division clock signal DCLK1Bd and may output the latched signal of the delayed chip selection signal ICSd as the second internal chip selection signal ICS2.

Figure 7:
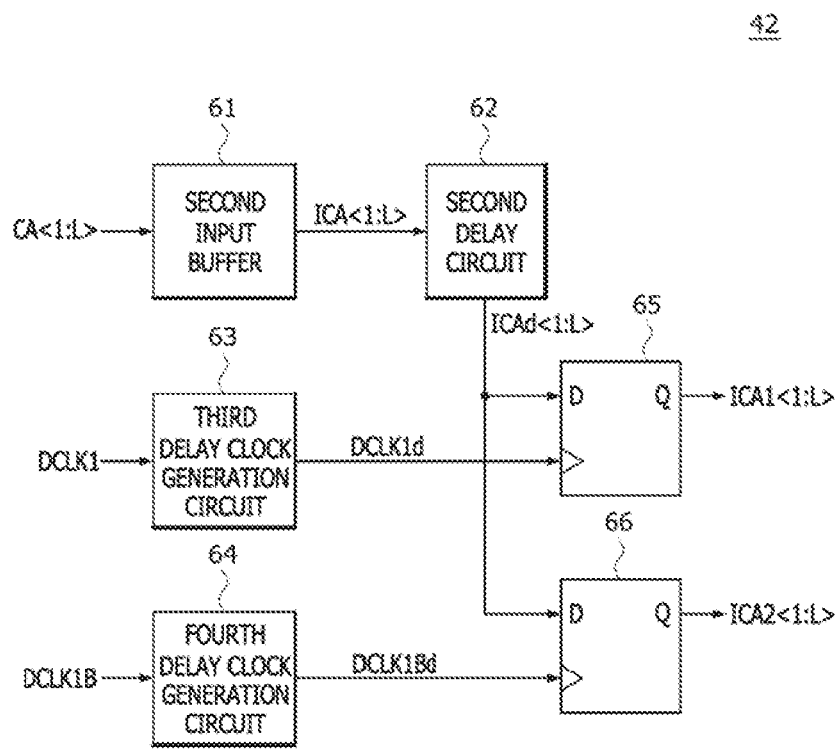
FIG. 7 illustrates an example of an internal control signal generation circuit, included in the input latch circuit of FIG. 5.

Referring to FIG. 7, the internal control signal generation circuit 42 may include a second input buffer 61, a second delay circuit 62, a third delay clock generation circuit 63, a fourth delay clock generation circuit 64, a third clock output/latch circuit 65, and a fourth clock output/latch circuit 66. The second input buffer 61 may buffer the external control signal CA<1:L> to generate an input control signal ICA<1:L>. The second delay circuit 62 may delay the input control signal ICA<1:L> to generate a delayed control signal ICAd<1:L>. The third delay clock generation circuit 63 may delay the first division clock signal DCLK1 to generate the first delayed division clock signal DCLK1d. The fourth delay clock generation circuit 64 may delay the first inverted division clock signal DCLK1B to generate the first delayed inverted division clock signal DCLK1Bd. The third clock output/latch circuit 65 may latch the delayed control signal ICAd<1:L> in synchronization with a rising edge of the first delayed division clock signal DCLK1d and may output the latched signal of the delayed control signal ICAd<1:L> as the first internal control signal ICA1<1:L>. The fourth clock output/latch circuit 66 may latch the delayed control signal ICAd<1:L> in synchronization with a rising edge of the first delayed inverted division clock signal DCLK1Bd and may output the latched signal of the delayed control signal ICAd<1:L> as the second internal control signal ICA2<1:L>.

Figure 8:
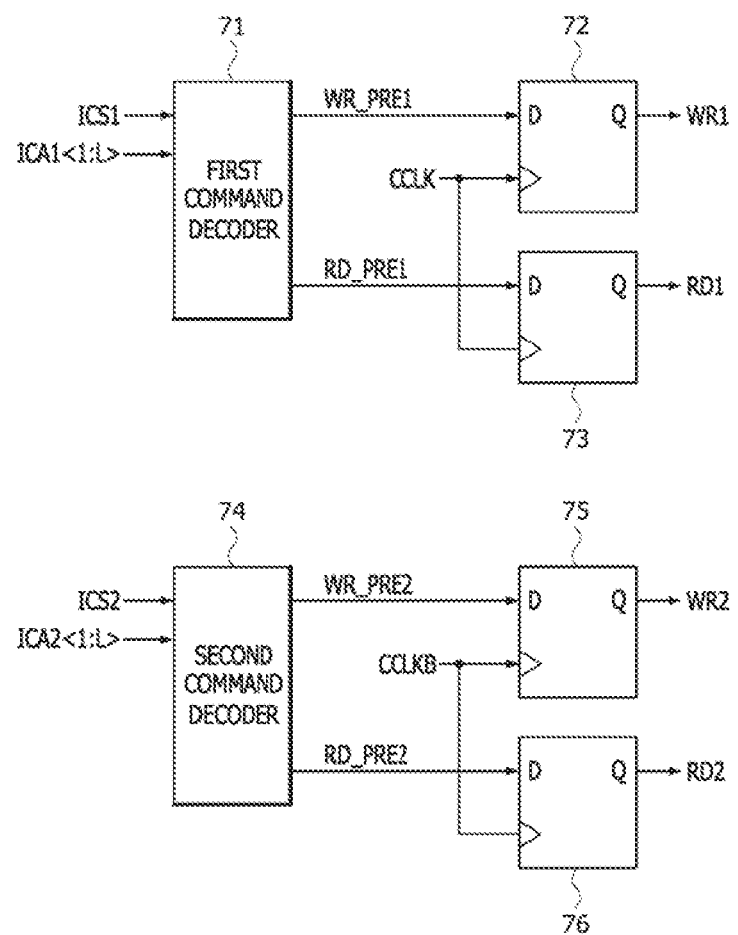
FIG. 8 illustrates an example of a command generation circuit, included in the semiconductor device of FIG. 1.

Referring to FIG. 8, the command generation circuit 13 may include a first command decoder 71, a first command output/latch circuit 72, a second command output/latch circuit 73, a second command decoder 74, a third command output/latch circuit 75, and a fourth command output/latch circuit 76.

When the first internal control signal ICA1<1:L> having the first logic level combination is inputted, the first command decoder 71 may generate a first pre-write command WR_PRE1 while the first internal chip selection signal ICS1 has a logic "high" level. When the first internal control signal ICA1<1:L> having the second logic level combination is inputted, the first command decoder 71 may generate a first pre-read command RD_PRE1 while the first internal chip selection signal ICS1 has a logic "high" level. The first command output/latch circuit 72 may latch the first pre-write command WR_PRE1 in synchronization with a rising edge of the command clock signal CCLK and may output the latched signal of the first pre-write command WR_PRE1 as the first write command WR1. The second command output/latch circuit 73 may latch the first pre-read command RD_PRE1 in synchronization with a rising edge of the command clock signal CCLK and may output the latched signal of the first pre-read command RD_PRE1 as the first read command RD1.

When the second internal control signal ICA2<1:L> having the third logic level combination is inputted, the second command decoder 74 may generate a second pre-write command WR_PRE2 while the second internal chip selection signal ICS2 has a logic "high" level. When the second internal control signal ICA2<1:L> having the fourth logic level combination is inputted, the second command decoder 74 may generate a second pre-read command RD_PRE2 while the second internal chip selection signal ICS2 has a logic "high" level. The third command output/latch circuit 75 may latch the second pre-write command WR_PRE2 in synchronization with a rising edge of the inverted command clock signal CCLKB and may output the latched signal of the second pre-write command WR_PRE2 as the second write command WR2. The fourth command output/latch circuit 76 may latch the second pre-read command RD_PRE2 in synchronization with a rising edge of the inverted command clock signal CCLKB and may output the latched signal of the second pre-read command RD_PRE2 as the second read command RD2.

When the first internal control signal ICA1<1:L> having the first logic level combination is inputted, the command generation circuit 13 may generate the first write command WR1 in synchronization with a rising edge of the command clock signal CCLK while the first internal chip selection signal ICS1 has a logic "high" level. When the first internal control signal ICA1<1:L> having the second logic level combination is inputted, the command generation circuit 13 may generate the first read command RD1 in synchronization with a rising edge of the command clock signal CCLK while the first internal chip selection signal ICS1 has a logic "high" level. When the second internal control signal ICA2<1:L> having the third logic level combination is inputted, the command generation circuit 13 may generate the second write command WR2 in synchronization with a rising edge of the inverted command clock signal CCLKB while the second internal chip selection signal ICS2 has a logic "high" level. When the second internal control signal ICA2<1:L> having the fourth logic level combination is inputted, the command generation circuit 13 may generate the second read command RD2 in synchronization with a rising edge of the inverted command clock signal CCLKB while the second internal chip selection signal ICS2 has a logic "high" level.

Figure 9:
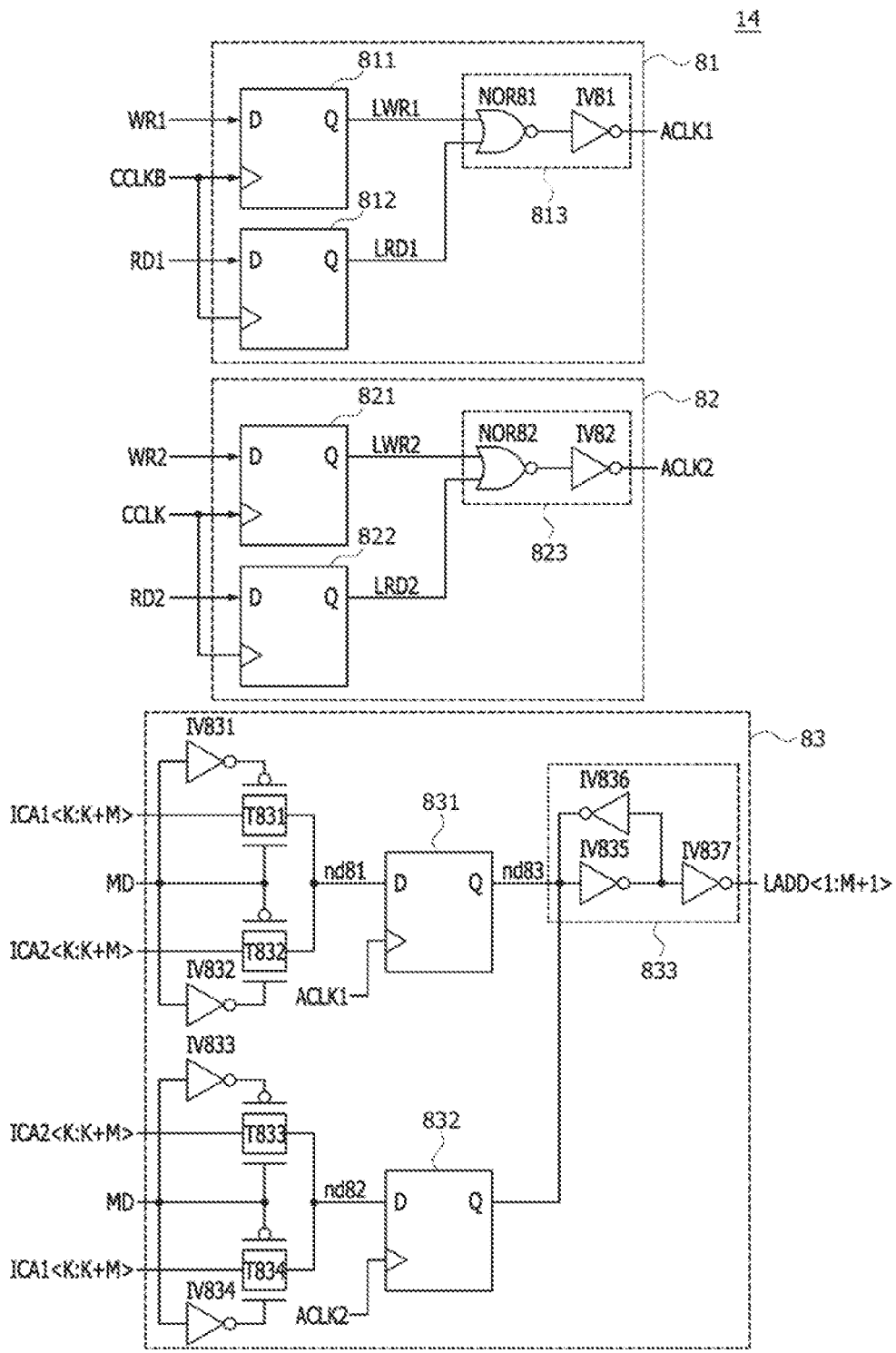
FIG. 9 is a circuit diagram, illustrating an example of an address generation circuit, included in the semiconductor device of FIG. 1.

Referring to FIG. 9, the address generation circuit 14 may include a first address clock generation circuit 81, a second address clock generation circuit 82, and a latch address generation circuit 83.

The first address clock generation circuit 81 may include a first write input latch 811, a first read input latch 812, and a first address clock output circuit 813. The first write input latch 811 may latch the first write command WR1 in synchronization with a rising edge of the inverted command clock signal CCLKB and may output the latched signal of the first write command WR1 as a first latched write command LWR1. The first read input latch 812 may latch the first read command RD1 in synchronization with a rising edge of the inverted command clock signal CCLKB and may output the latched signal of the first read command RD1 as a first latched read command LRD1. The first address clock output circuit 813 may include a NOR gate NOR81 and an inverter IV81, which are coupled in series, to perform a logical OR operation. When the first latched write command LWR1 or the first latched read command LRD1 is generated to have a logic "high" level, the first address clock output circuit 813 may generate a first address clock signal ACLK1 having a logic "high" level. When the first write command WR1 or the first read command RD1 is generated to have a logic "high" level, the first address clock generation circuit 81 may be synchronized with a rising edge of the inverted command clock signal CCLKB to generate the first address clock signal ACLK1 having a logic "high" level.

The second address clock generation circuit 82 may include a second write input latch 821, a second read input latch 822, and a second address clock output circuit 823. The second write input latch 821 may latch the second write command WR2 in synchronization with a rising edge of the command clock signal CCLK and may output the latched signal of the second write command WR2 as a second latched write command LWR2. The second read input latch 822 may latch the second read command RD2 in synchronization with a rising edge of the command clock signal CCLK and may output the latched signal of the second read command RD2 as a second latched read command LRD2. The second address clock output circuit 823 may include a NOR gate NOR82 and an inverter IV82, which are coupled in series, to perform a logical OR operation.

When the second latched write command LWR2 or the second latched read command LRD2 is generated to have a logic "high" level, the second address clock output circuit 823 may generate a second address clock signal ACLK2 having a logic "high" level. When the second write command WR2 or the second read command RD2 is generated to have a logic "high" level, the second address clock generation circuit 82 may be synchronized with a rising edge of the command clock signal CCLK to generate the second address clock signal ACLK2 having a logic "high" level.

The latch address generation circuit 83 may include inverters IV831, IV832, IV833 and IV834, transfer gates T831, T832, T833 and T834, a first address transmission/latch circuit 831, a second address transmission/latch circuit 832, and a latch address output circuit 833. The inverter IV831 may inversely buffer the mode signal MD to output the inversely buffered signal of the mode signal MD. When the mode signal MD has a logic "high" level, the transfer gate T831 may be turned on to output the first internal control signal ICA1<K:K+M> to a node nd81. The inverter IV832 may inversely buffer the mode signal MD to output the inversely buffered signal of the mode signal MD. When the mode signal MD has a logic "low" level, the transfer gate T832 may be turned on to output the second internal control signal ICA2<K:K+M> to the node nd81. The first address transmission/latch circuit 831 may latch a signal of the node nd81 in synchronization with a rising edge of the first address clock signal ACLK1 and may output the latched signal of the node nd81 to a node nd83. The inverter IV833 may inversely buffer the mode signal MD to output the inversely buffered signal of the mode signal MD. When the mode signal MD has a logic "high" level, the transfer gate T833 may be turned on to output the second internal control signal ICA2<K:K+M> to a node nd82. The inverter IV834 may inversely buffer the mode signal MD to output the inversely buffered signal of the mode signal MD. When the mode signal MD has a logic "low" level, the transfer gate T834 may be turned on to output the first internal control signal ICA1<K:K+M> to the node nd82. The second address transmission/latch circuit 832 may latch a signal of the node nd82 in synchronization with a rising edge of the second address clock signal ACLK2 and may output the latched signal of the node nd82 to the node nd83. The latch address output circuit 833 include inverters IV835, IV836, and IV837. The latch address output circuit 833 may buffer a signal of the node nd83 to output the buffered signal of the node nd83 as the latch address LADD<1:M+1>. The latch address output circuit 833 may latch the signal of the node nd83.

When the first write command WR1 is generated, the address generation circuit 14 may latch the second internal control signal ICA2<K:K+M> to generate the latch address LADD<1:M+1> while the mode signal MD has a logic "low" level. When the second write command WR2 is generated, the address generation circuit 14 may latch the first internal control signal ICA1<K:K+M> to generate the latch address LADD<1:M+1> while the mode signal MD has a logic "low" level. When the first write command WR1 is generated, the address generation circuit 14 may latch the first internal control signal ICA1<K:K+M> to generate the latch address LADD<1:M+1> while the mode signal MD has a logic "high" level. When the second write command WR2 is generated, the address generation circuit 14 may latch the second internal control signal ICA2<K:K+M> to generate the latch address LADD<1:M+1> while the mode signal MD has a logic "high" level. When the first read command RD1 is generated, the address generation circuit 14 may latch the second internal control signal ICA2<K:K+M> to generate the latch address LADD<1:M+1> while the mode signal MD has a logic "low" level. When the second read command RD2 is generated, the address generation circuit 14 may latch the first internal control signal ICA1<K:K+M> to generate the latch address LADD<1:M+1> while the mode signal MD has a logic "low" level. When the first read command RD1 is generated, the address generation circuit 14 may latch the first internal control signal ICA1<K:K+M> to generate the latch address LADD<1:M+1> while the mode signal MD has a logic "high" level. When the second read command RD2 is generated, the address generation circuit 14 may latch the second internal control signal ICA2<K:K+M> to generate the latch address LADD<1:M+1> while the mode signal MD has a logic "high" level.

Figure 10:
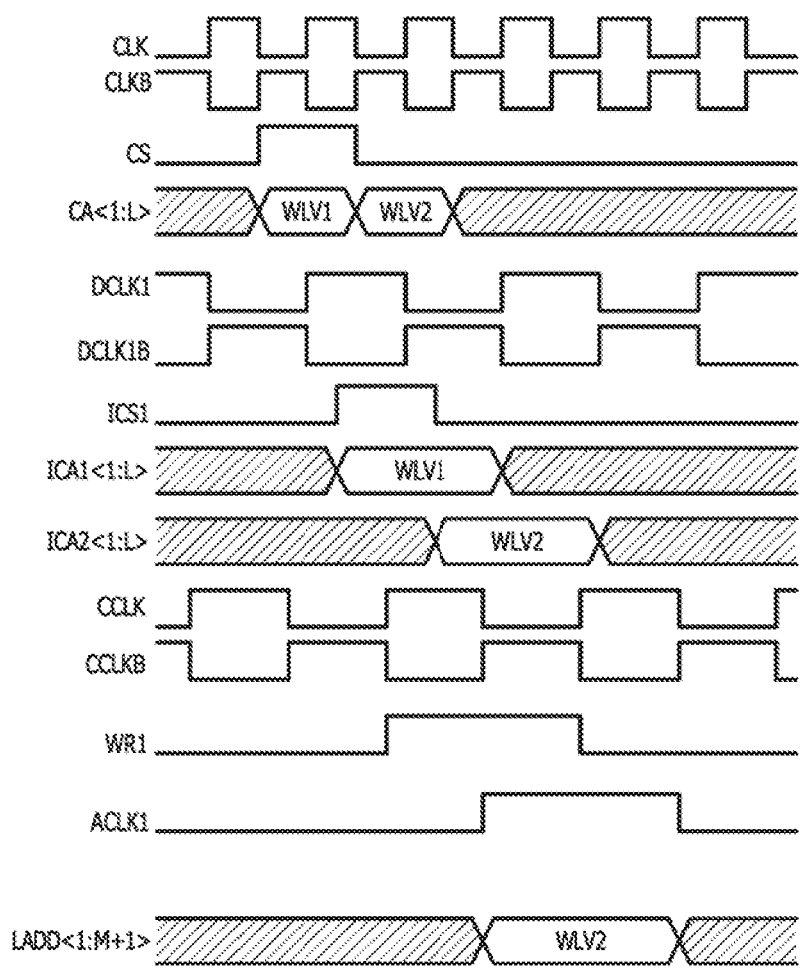
FIGS. 10 and 11 are timing diagrams, illustrating operations of the semiconductor device, shown in FIG. 1.

An operation of the semiconductor device 100 will be described hereinafter with reference to FIG. 10 in conjunction with an example in which the mode signal MD having a logic "low" level is inputted to activate the first mode.

In the first mode, the clock signal CLK and the inverted clock signal CLKB are divided to generate the first division clock signal DCLK1 and the first inverted division clock signal DCLK1B, and the command clock signal CCLK and the inverted command clock signal CCLKB may be generated from the first division clock signal DCLK1 and the first inverted division clock signal DCLK1B. When the external control signal CA<1:L> having the first write level combination WLV1 is inputted in synchronization with the first division clock signal DCLK1, the first internal control signal ICA1<1:L> having a first write level combination WLV1 may be generated. When the external control signal CA<1:L> having the second write level combination WLV2 is inputted in synchronization with the first inverted division clock signal DCLK1B, the second internal control signal ICA2<1:L> having a second write level combination WLV2 may be generated. While the first internal chip selection signal ICS1 is generated to have a logic "high" level, the first internal control signal ICA1<1:L> having the first write level combination WLV1 may be latched at a rising edge of the command clock signal CCLK to generate the first write command WR1 having a logic "high" level. The first internal chip selection signal ICS1 may be generated by latching the chip selection signal CS in synchronization with a rising edge of the first division clock signal DCLK1 and by delaying the latched signal of the chip selection signal CS.

When the first write command WR1 is generated to have a logic "high" level, the first address clock signal ACLK1 may be generated to have a logic "high" level in synchronization with the inverted command clock signal CCLKB. When the first address clock signal ACLK1 is generated to have a logic "high" level, the second internal control signal ICA2<1:L> having the second write level combination WLV2 may be latched and the latched signal of the second internal control signal ICA2<1:L> may be outputted as the latch address LADD<1:M+1>.

As described above, if the external control signal CA<1:L> having the first write level combination WLV1 is inputted in synchronization with the first division clock signal DCLK1 and the external control signal CA<1:L> having the second write level combination WLV2 is inputted in synchronization with the first inverted division clock signal DCLK1B in the first mode, the semiconductor device 100 according to an embodiment may generate the latch address LADD<1:M+1> at a point in time when one cycle of the clock signal CLK elapses from a point in time when the first write command WR1 is generated. Alternatively, even though the external control signal CA<1:L> having the first write level combination WLV1 is inputted in synchronization with the first inverted division clock signal DCLK1B and the external control signal CA<1:L> having the second write level combination WLV2 is inputted in synchronization with the first division clock signal DCLK1 in the first mode, the semiconductor device 100 may generate the latch address LADD<1:M+1> at a point in time when one cycle of the clock signal CLK elapses from a point in time when the first write command WR1 is generated.

Figure 11:
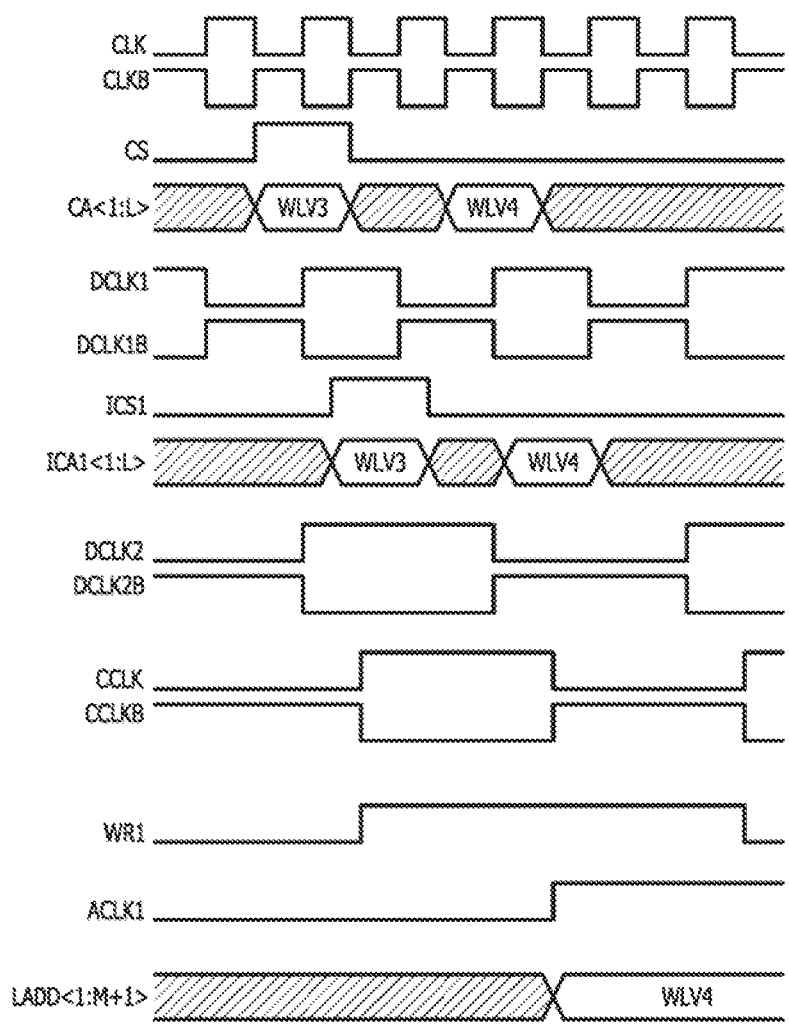

An operation of the semiconductor device 100 will be described hereinafter with reference to FIG. 11 in conjunction with an example in which the mode signal MD having a logic "high" level is inputted to activate the second mode.

In the second mode, the clock signal CLK and the inverted clock signal CLKB may be divided to generate the first division clock signal DCLK1 and the first inverted division clock signal DCLK1B. Furthermore, the first division clock signal DCLK1 and the first inverted division clock signal DCLK1B may be divided to generate the second division clock signal DCLK2 and the second inverted division clock signal DCLK2B. The command clock signal CCLK and the inverted command clock signal CCLKB may be generated from the second division clock signal DCLK2 and the second inverted division clock signal DCLK2B. When the external control signal CA<1:L> having the third write level combination WLV3 is inputted in synchronization with the first division clock signal DCLK1, the first internal control signal ICA1<1:L> having a third write level combination WLV3 may be generated. When the external control signal CA<1:L> having the fourth write level combination WLV4 is inputted in synchronization with the first division clock signal DCLK1, the first internal control signal ICA1<1:L> having a fourth write level combination WLV4 may be generated. While the first internal chip selection signal ICS1 is generated to have a logic "high" level, the first internal control signal ICA1<1:L> having the third write level combination WLV3 may be latched at a rising edge of the command clock signal CCLK to generate the first write command WR1 having a logic "high" level. When the first write command WR1 is generated to have a logic "high" level, the first address clock signal ACLK1 may be generated to have a logic "high" level in synchronization with the inverted command clock signal CCLKB. When the first address clock signal ACLK1 is generated to have a logic "high" level, the first internal control signal ICA1<1:L> having the fourth write level combination WLV4 may be latched and the latched signal of the first internal control signal ICA1<1:L> may be outputted as the latch address LADD<1:M+1>.

As described above, if the external control signal CA<1:L> having the third write level combination WLV3 is inputted in synchronization with the first division clock signal DCLK1 and the external control signal CA<1:L> having the fourth write level combination WLV4 is inputted in synchronization with the first division clock signal DCLK1 in the second mode, the semiconductor device 100 according to an embodiment may generate the latch address LADD<1:M+1> at a point in time when two cycles of the clock signal CLK elapse from a point in time when the first write command WR1 is generated. Alternatively, even though the external control signal CA<1:L> having the third write level combination WLV3 is inputted in synchronization with the first inverted division clock signal DCLK1B and the external control signal CA<1:L> having the fourth write level combination WLV4 is inputted in synchronization with the first inverted division clock signal DCLK1B in the second mode, the semiconductor device 100 may generate the latch address LADD<1:M+1> at a point in time when two cycles of the clock signal CLK elapse from a point in time when the first write command WR1 is generated.

The semiconductor device 100, according to an embodiment, may generate an internal address at a point in time when one cycle of the clock signal elapses from a point in time when an internal command is generated using the command clock signal CCLK and the inverted command clock signal CCLKB, which are generated to be 2-division signals of the clock signal in a first mode, and may generate the internal address at a point in time when two cycles of the clock signal elapse from a point in time when the internal command is generated using the command clock signal CCLK and the inverted command clock signal CCLKB, which are generated to be 4-division signals of the clock signal in a second mode. The semiconductor device 100 may set an operation mode as the second mode when a frequency of the clock signal CLK increases for a high operation speed of the semiconductor device 100, thereby increasing a margin between the internal command and the internal address such that the internal address is stably generated after the internal command is generated. The semiconductor device 100 may increase the number of times that the clock signal CLK is divided to control a cycle of the command clock signal CCLK and the inverted command clock signal CCLKB. Thus, a margin between the internal command and the internal address may be controlled using a circuit whose layout area and power consumption are minimized.

Figure 12:
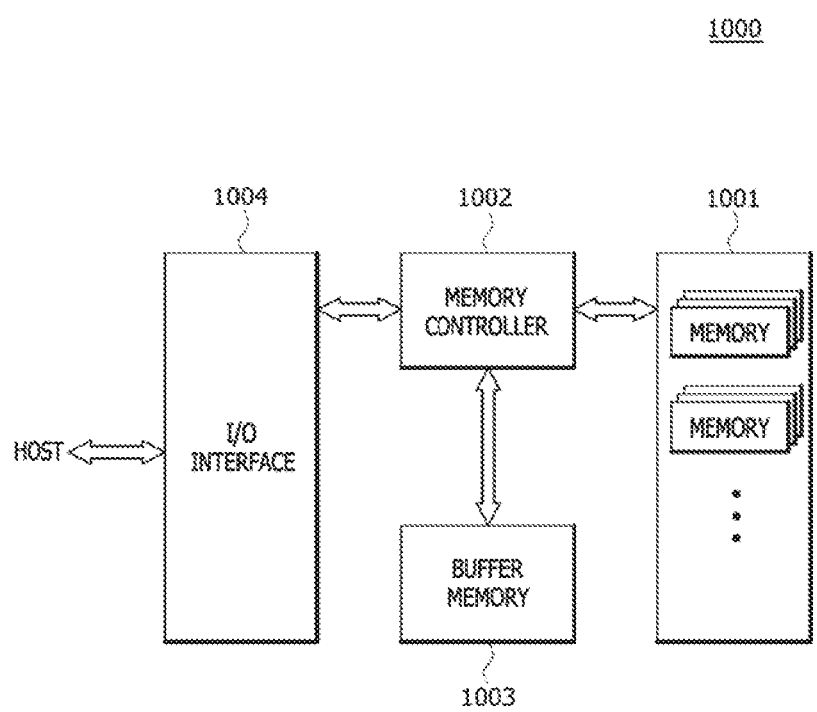
FIG. 12 is a block diagram, illustrating a configuration of an electronic system including the semiconductor device, shown in FIG. 1.

The semiconductor device 100 described with reference to FIG. 1 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include the semiconductor device 100 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
an internal clock generation circuit configured to generate a command clock signal and an inverted command clock signal, wherein a cycle of the command clock signal and a cycle of the inverted command clock signal are determined by a mode;
a command generation circuit configured to generate a first command based on a first internal control signal and the command clock signal and configured to generate a second command based on a second internal control signal and the inverted command clock signal; and
an address generation circuit configured to generate a latch address based on the first internal control signal or a second internal control signal based on the command clock signal, the inverted command clock signal, the first command, and the second command according to the mode.

2. The semiconductor device of claim 1,
wherein the mode includes a first mode and a second mode;
wherein in the first mode, the latch address is generated at a point in time when a period corresponding to 'N' times a cycle of a clock signal elapses from a point in time when the first command or the second command is generated;
wherein in the second mode, the latch address is generated at a point in time when a period corresponding to '2×N' times a cycle of the clock signal elapses from a point in time when the first command or the second command is generated; and
wherein the number 'N' is a natural number.

3. The semiconductor device of claim 1,
wherein the mode includes a first mode and a second mode;
wherein the internal clock generation circuit is configured to generate the command clock signal and the inverted command clock signal having a cycle which is equal to '2×K' times a cycle of a clock signal in the first mode and is configured to generate the command clock signal and the inverted command clock signal having a cycle which is equal to '4×K' times a cycle of the clock signal in the second mode; and
wherein the number 'K' is a natural number.

4. The semiconductor device of claim 1, wherein the internal clock generation circuit divides a clock signal to generate a first division clock signal and a first inverted division clock signal which have a cycle which is equal to '2×K' times a cycle of the clock signal and to generate a second division clock signal and a second inverted division clock signal which have a cycle which is equal to '4×K' times a cycle of the clock signal;
wherein the number 'K' is a natural number.

5. The semiconductor device of claim 4,
wherein the first internal control signal is generated by latching an external control signal in synchronization with the first division clock signal; and
wherein the second internal control signal is generated by latching the external control signal in synchronization with the first inverted division clock signal.

6. The semiconductor device of claim 1,
wherein the first command includes a first write command for performing a write operation and a first read command for performing a read operation; and
wherein the second command includes a second write command for performing the write operation and a second read command for performing the read operation.

7. The semiconductor device of claim 6,
wherein the command generation circuit is configured to generate the first write command based on the command clock signal when the first internal control signal having a first logic level combination is inputted to the command generation circuit and is configured to generate the first read command based on the command clock signal when the first internal control signal having a second logic level combination is inputted to the command generation circuit; and wherein the command generation circuit is configured to generate the second write command based on the inverted command clock signal when the second internal control signal having a third logic level combination is inputted to the command generation circuit and is configured to generate the second read command based on the inverted command clock signal when the second internal control signal having a fourth logic level combination is inputted to the command generation circuit.

8. The semiconductor device of claim 1,
wherein the mode includes a first mode and a second mode;
wherein the address generation circuit is configured to generate the latch address based on the second internal control signal when the first command is generated in the first mode; and
wherein the address generation circuit is configured to generate the latch address based on the first internal control signal when the first command is generated in the second mode.

9. The semiconductor device of claim 1,
wherein the mode includes a first mode and a second mode;
wherein the address generation circuit is configured to generate the latch address based on the first internal control signal when the second command is generated in the first mode; and
wherein the address generation circuit is configured to generate the latch address based on the second internal control signal when the second command is generated in the second mode.

10. The semiconductor device of claim 1, wherein the address generation circuit includes:
a first address clock generation circuit configured to generate a first address clock signal based on the first command and the inverted command clock signal;
a second address clock generation circuit configured to generate a second address clock signal based on the second command and the command clock signal; and
a latch address generation circuit configured to output the first internal control signal or the second internal control signal as the latch address based on the mode, the first address clock signal, and the second address clock signal.

11. The semiconductor device of claim 10,
wherein the mode includes a first mode and a second mode; and
wherein the latch address generation circuit is configured to output the second internal control signal as the latch address when the first address clock signal is generated in the first mode and is configured to output the first internal control signal as the latch address when the first address clock signal is generated in the second mode.

12. The semiconductor device of claim 10,
wherein the mode includes a first mode and a second mode; and
wherein the latch address generation circuit is configured to output the first internal control signal as the latch address when the second address clock signal is generated in the first mode and is configured to output the second internal control signal as the latch address when the second address clock signal is generated in the second mode.

\* \* \* \* \*